United States Patent
Martin et al.

(10) Patent No.: US 9,722,278 B2
(45) Date of Patent: Aug. 1, 2017

(54) METHOD FOR PRODUCING A LITHIUM-BASED ELECTROLYTE FOR A SOLID MICROBATTERY

(71) Applicant: COMMISSARIAT A L'ENERGIE ATOMIQUE ET AUX ENERGIES ALTERNATIVES, Paris (FR)

(72) Inventors: Steve Martin, St Sauveur (FR); Johnny Amiran, Eydoche (FR); Lucie Le Van-Jodin, Grenoble (FR); Sami Oukassi, Saint Egreve (FR)

(73) Assignee: COMMISSARIAT A L'ENERGIE ATOMIQUE ET AUX ENERGIES ALTERNATIVES (FR)

( * ) Notice: Subject to any disclaimer, the term of this patent is extended or adjusted under 35 U.S.C. 154(b) by 198 days.

(21) Appl. No.: 14/418,352

(22) PCT Filed: Aug. 23, 2013

(86) PCT No.: PCT/FR2013/051961
§ 371 (c)(1),
(2) Date: Jan. 29, 2015

(87) PCT Pub. No.: WO2014/037646
PCT Pub. Date: Mar. 13, 2014

(65) Prior Publication Data
US 2015/0194700 A1    Jul. 9, 2015

(30) Foreign Application Priority Data
Sep. 7, 2012 (FR) .................. 12 58405

(51) Int. Cl.
*H01M 10/0562* (2010.01)
*H01M 6/18* (2006.01)
(Continued)

(52) U.S. Cl.
CPC ......... *H01M 10/0562* (2013.01); *C23C 14/34* (2013.01); *H01M 6/188* (2013.01); *H01M 10/052* (2013.01); *H01M 2300/0068* (2013.01)

(58) Field of Classification Search
CPC ............. H01M 10/052; H01M 10/056; H01M 2300/0094; H01M 6/187; H01M 4/13;
(Continued)

(56) References Cited

U.S. PATENT DOCUMENTS 3,652,443 A * 3/1972 Fish .................... C10M 3/00
204/192.12
5,202,008 A    4/1993 Talieh et al.
(Continued)

FOREIGN PATENT DOCUMENTS

| EP | 0627497 A1 | 12/1994 |
| WO | 2006081004 A2 | 8/2006 |
| WO | 2010068624 A2 | 6/2010 |

OTHER PUBLICATIONS

International Search Report Application No. PCT/FR2013/051961 Completed: Oct. 30, 2013; Mailing Date: Nov. 11, 2013 3 pages.

*Primary Examiner* — Lucas J. O'Donnell
(74) *Attorney, Agent, or Firm* — St. Onge Steward Johnston & Reens, LLC

(57) ABSTRACT

A method for producing a solid lithium-based electrolyte for a solid microbattery implements the cathode sputtering of a lithium-based target material on an object supported by a substrate holder. A grid made of lithium-free electrically conductive material is interposed between the object and the lithium-based target material, the grid being electrically connected to the substrate holder.

15 Claims, 3 Drawing Sheets

(51) Int. Cl.
*C23C 14/34* (2006.01)
*H01M 10/052* (2010.01)

(58) Field of Classification Search
CPC ...... H01M 4/131; H01M 4/134; H01M 4/139; H01M 4/366; H01M 4/661; H01M 10/0562; H01M 2300/0068; H01M 10/0565; H01M 10/058
See application file for complete search history.

(56) References Cited

U.S. PATENT DOCUMENTS

| | | |
|---|---|---|
| 5,382,339 A | 1/1995 | Aranovich |
| 5,409,587 A | 4/1995 | Sandhu et al. |
| 5,945,354 A | 8/1999 | Mautz |
| 6,168,696 B1 | 1/2001 | Burton et al. |
| 6,454,912 B1 | 9/2002 | Ahn et al. |
| 8,753,724 B2 * | 6/2014 | Nieh ................ H01J 37/32422 427/115 |
| 2002/0130032 A1 | 9/2002 | Ahn et al. |
| 2009/0159433 A1 * | 6/2009 | Neudecker .......... C23C 14/0036 204/192.15 |
| 2014/0087092 A1 * | 3/2014 | Nieh ................ H01J 37/32422 427/569 |

* cited by examiner

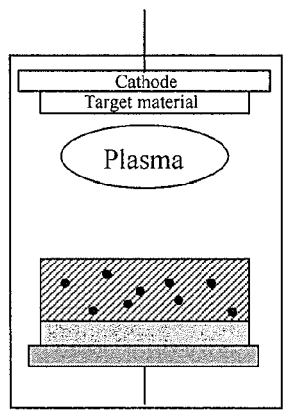
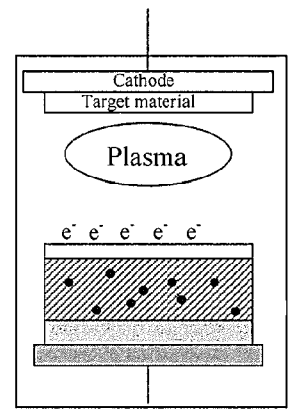
Figure 3a)
(prior art)
Figure 3b)
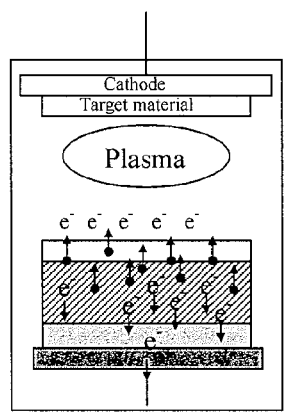
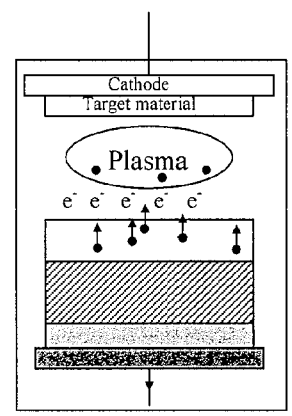
Figure 3c)
(prior art)
Figure 3d)
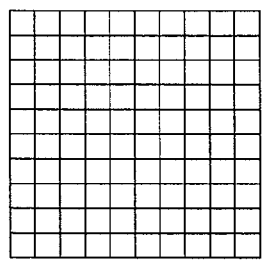
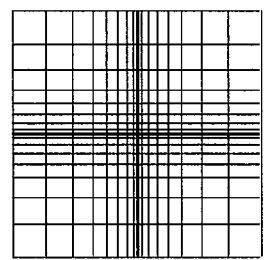
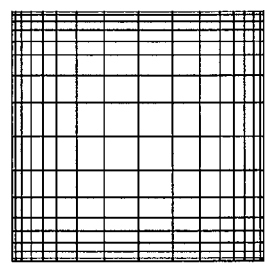
Figure 4a)
Figure 4b)
Figure 4c)

METHOD FOR PRODUCING A LITHIUM-BASED ELECTROLYTE FOR A SOLID MICROBATTERY

FIELD OF THE INVENTION

The invention relates to a method of forming a solid electrolyte by cathode sputtering of a lithium-based material.

The field of the present invention particularly relates to the manufacturing of solid microbatteries, capable of being used to power microsystems such as chip cards or smart tags, for example.

BACKGROUND OF THE INVENTION

An "all-solid" microbattery is an electrochemical component enabling to store energy. Such batteries, having a total thickness smaller than 15 micrometers, have the specificity of having a solid electrolyte.

Generally, their structure comprises a stack of the following layers (FIG. 1):
  a substrate;
  a current collector for the cathode;
  a cathode material;
  a solid electrolyte material;
  an anode material;
  a current collector for the anode.

The layers of materials may be formed by successive CVDs (chemical vapor depositions), possibly plasma-enhanced (PE-CVD), or by PVD (Physical Vapor Deposition), and particularly by cathode sputtering for the electrolyte.

In the case of all-solid microbatteries implying lithium ions, the latter transit between the anode and the cathode where oxidation-reduction reactions take place.

Such reactions imply an electron exchange according to an external circuit. Indeed, the electrolyte separating the cathode from the anode blocks the passage of electrons. Such an electron exchange thus enables to ensure the microbattery charge/discharge cycles.

Two types of lithium-based microbatteries may be distinguished:
  lithium microbatteries, having their lithium ions originating from a metal lithium anode;
  Li-ion microbatteries, having their lithium ions originating from a lithiated electrode material (cathode or anode).

Li-ion batteries may be manufactured either in the charged state, or in the discharged state. In the first case, lithium is present in the anode layer at the time of the manufacturing, while it is present in the cathode layer in the second case.

The solid electrolyte may be formed by cathode sputtering deposition in a reactor generally having a so-called parallel planar geometry (FIG. 2). In this technique, a target material (8) having a chemical composition close to that desired for the electrolyte is attached to a metal support (cathode (9)) in a reactor or chamber (5). This cathode (9) is negatively biased by means of an electric generator. Under the effect of the electric field, the gas ($N_2$ for example) present in the vicinity of the target (8) is ionized. The positive ions of the ionized gas bombard the target and expel atoms from the target. These atoms then deposit back on the surface opposite to where the object (14) to be covered, supported by an object-holder (13), is placed.

To avoid disturbing the growth of the deposit, nothing separates the target from the substrate to be covered with the electrolyte.

However, the deposition of a solid electrolyte on a previously-lithiated electrode may generate problems specifically linked to the technology of lithium accumulators.

Indeed, in a cathode sputtering deposition method, on deposition of the electrolyte layer on a lithiated electrode layer (FIG. 3a), the surface of the sample to be covered cannot drain off incident electrons (FIG. 3b). Accordingly, it charges negatively until it reaches a so-called floating potential in equilibrium with the potential of the plasma (FIG. 3b).

The presence of negative charges at the surface results in attracting the lithium present in the lithiated electrode. Thus, lithium diffuses through the growing electrolyte, towards the surface in contact with the plasma. Simultaneously, the electrons, created by the deinsertion of lithium ions $Li^+$, are drained off from the lithiated electrode via the substrate holder (FIG. 3c). The lithium excess at the surface of the electrolyte is ejected back into the plasma (FIG. 3d). Such a "depletion" phenomenon impoverishes the lithium structure, and thus causes a decrease in the electrochemical performance.

The depletion phenomenon occurs during the solid electrolyte deposition. It depends:
  on the lithiated materials of the electrode. Indeed, the higher the potential of the lithiated electrode relative to the metal lithium, the less the phenomenon will be marked. Accordingly, prior art microbatteries generally comprise a cathode made of lithiated cobalt oxide ($LiCoO_2$) which has a lower potential than, particularly, a cathode based on $LiV_2O_5$, SiLi, GeLi, $Li_4Ti_5O_{12}$, LiTiOS, $LiTiS_2$.
  on the diffusion speed of lithium within the lithiated electrode material. The faster lithium diffuses in the material, the faster the microbattery will discharge, possibly integrally before the electrolyte deposition.
  on the geometry of the reactor having the electrolyte manufactured therein. Indeed, the floating potential acquired by a part plunged in a plasma chamber depends on the conditions of electric excitation of this plasma (pressure, power, nature of the gases . . . ), but also on the geometry of the deposition chamber.
  on the architecture of the stack comprising the cathode/electrolyte/anode sequence. Prior art battery manufacturing methods may implement so-called "shadow mask" techniques on insulating substrates (polyamide, PEN, borosilicate, mica . . . ). Such methods enable to form a plurality of batteries of small dimensions (typically <10 $cm^2$) simultaneously in a same deposition reactor. In such methods, the lithiated electrode having the electrolyte deposited thereon is electrically insulated from the rest of the deposition frame. Thus, the electrons released during the possible deinsertion of the lithium of the lithiated electrode remain confined within the latter, thus limiting the depletion process.

The problem that the present invention aims at solving particularly relates to the forming of a solid lithium-based electrolyte layer while avoiding the depletion phenomenon, that is, the accumulation of negative charges at the surface of the sample during a solid electrolyte material deposition.

SUMMARY OF THE INVENTION

The Applicant has developed a method of forming a solid electrolyte by implementing the cathode sputtering technique.

Cathode sputtering enables to deposit a thin layer of material on a substrate. The synthesis of the solid electrolyte implies a condensation on the substrate of a target material vaporized in a chamber (reactor), possibly in the presence of other chemical elements.

The invention particularly comprises, in a cathode sputtering method, positioning an electronically-conductive grid between the sample to be covered and the cathode having the target to be sputtered placed thereon. The grid thus provides a shielding against negative electronic charges (electrons) generated by the plasma, to limit their accumulation on the surface of the growing electrolyte.

More specifically, the invention relates to a method of forming a solid lithium-based electrolyte for an all-solid microbattery, by cathode sputtering of a lithium-based target material on an object supported by a substrate holder. In this method, a grid made of lithium-free electrically-conductive material is interposed between the lithium-based target material and the object. Further, the grid is electrically connected to the substrate holder.

The grid of electrically-conductive material comprises no lithium. It may advantageously be formed by means of at least one metal selected from the group comprising titanium, aluminum, stainless steel, tungsten, platinum, copper, and alloys based on these metals.

As concerns the position of the grid relative to the object, the grid is preferably positioned at a distance in the range from 1 to 100 millimeters from the object having the electrolyte formed thereon, preferably from 5 to 50 millimeters, more advantageously still 20 millimeters.

In the device, or reactor or chamber, used to implement the method of the invention, it is preferable for the distance between the grid and the substrate to be adjusted to minimize the shading effect due to the grid while keeping a low potential difference between the two interfaces of the growing electrolyte. Indeed, when the grid is too close to the surface of the object to be covered, the deposited electrolyte layer will have the same pattern as the grid. In this case, the grid may thus act as a mask which prevents a homogeneous deposition over the entire surface. Conversely, when the grid is too distant from the surface of the object, the technical effect provided by the grid, that is, the forming of a shield, may be relatively decreased, or even canceled.

Further, the grid thickness is advantageously smaller than 10 millimeters, to avoid collimating the species. In other words, the electrolyte is homogeneously deposited on the object over the entire surface of the object to be covered, and not along the grid patterns.

Preferably, the grid thickness may be in the range from 50 to 500 micrometers, preferably 100 or 250 micrometers, more advantageously still in the order of 200 micrometers.

The grid is formed of wires capable of defining at least one pattern which may be repeated. The wires may also have different thicknesses or diameters.

According to a specific embodiment, the grid may be formed of a plurality of wires extending along at least two directions, advantageously two substantially perpendicular directions. The wire diameter or thickness may advantageously be in the range from 50 to 500 micrometers, preferably 100 or 250 micrometers, more advantageously still in the order of 200 micrometers.

In top view, the grid may advantageously have two axes of symmetry.

The grid shape may vary; it may in particular have a rectangular, square, oval, or circular shape.

Actually, the shape and the dimensions of the grid can be adjusted according to the object to be covered with solid electrolyte. They are such that the main surface of the grid is advantageously at least equal to the surface to be covered of said object.

In the case where the grid has a plurality of crossing wires, the wire crossings preferably generate no additional thickness. In any case, grid thickness means the maximum thickness and not the mean thickness. Accordingly, the grid thickness and the wire thickness are not necessarily identical.

The length and the width of the grid also depend on the reactor where the method is implemented.

In the case where the grid comprises a plurality of wires extending along a same direction, the latter are advantageously spaced apart from one another by a distance between wires in the range from 0.5 millimeters to 2 centimeters, advantageously 2 millimeters. The distance between two consecutive wires may vary within a same grid.

The grid may thus also comprise a plurality of distances between wires.

Further, the grid may also comprise concentric patterns.

As already mentioned, the grid is interposed between the lithium-based target material, that is, the electrolyte material target, and the object having the electrolyte deposited thereon. This object may successively comprise, towards the substrate holder, an electrode, a current collector and possibly a substrate.

The object advantageously is an electrode, more advantageously still a lithiated electrode.

As already mentioned, the grid is electrically connected to the substrate holder. It may also be connected to the substrate and/or to the current collector and/or to the electrode. According to a specific embodiment, the grid may thus be connected to the substrate holder, to the substrate, to the current collector, and to the electrode.

According to another specific embodiment, the electric connection between the grid and at least the substrate holder is provided by a metal ring. Metal ring designates means for ensuring the electric connection. The ring may be a material selected from the group comprising titanium, stainless steel, tungsten, molybdenum, copper, platinum, and mixtures thereof.

Generally, the lithium precursor or lithium-based target material used in the method of the invention may in particular be a solid lithium-based material selected from the group particularly comprising $Li_3PO_4$, LiSiPON, LiGePS, and LiSON.

This lithium-based target electrolyte material generally appears in the form of a layer previously formed or deposited on the cathode of the cathode sputtering device according to prior art techniques known by those skilled in the art.

Apart from lithium, the lithiated electrolyte formed according to the method which is the object of the invention may contain elements such as phosphorus, nitrogen, oxygen, silicon, titanium, lanthanum, germanium, and mixtures thereof. For example, the presence of nitrogen may enable to increase the ion conductivity of the electrolyte.

Thus, according to a specific embodiment, the cathode sputtering may be performed in the presence of nitrogen to form an electrolyte comprising nitrogen.

For example, the electrolyte material deposited on the object by implementation of the method of the invention may in particular be LiPON (Lithium Phosphorous OxyNitride), LiSiPON (Nitrogen-incorporated Lithium SilicoPhosphate), or LiSON (Lithium Sulfur Oxynitride).

The current collectors are advantageously metallic and may for example be based on titanium, tungsten, nickel, platinum, copper, and gold.

The substrate may advantageously be made of silicon; of metal such as titanium, stainless steel, nickel, or tungsten; of borosilicate; of quartz, of MICA; of polymeric nature (polyimide, PEN).

The metallic current collector may advantageously be made of a titanium, tungsten, platinum, or copper layer.

Further, the substrate holder may particularly be made of metal or ceramic.

The present invention also aims at the solid electrolyte obtained by implementing the method which is the object of the invention. The object, or the electrode, having the electrolyte deposited thereon according to the above-described method also pertains to the present invention, as well as the microbattery comprising the solid electrolyte, this object, or this electrode, comprising the electrolyte.

The device, that is, the reactor used to implement the above-described method of preparing a lithiated electrolyte by cathode sputtering, also pertains to the present invention.

The invention and the resulting advantages will better appear from the following non-limiting drawings and examples, provided as an illustration of the invention.

BRIEF DESCRIPTION OF THE DRAWINGS

FIGS. 3a-d illustrate the steps of lithium depletion during the deposition of the electrolyte on a lithiated electrode according to prior art methods implementing the cathode sputtering technique.

FIGS. 4a-c concern examples of structures of the grid used in the method of the present invention.

DETAILED DESCRIPTION OF THE INVENTION

The method according to the invention uses a grid having a plurality of examples of its possible structures illustrated in FIGS. 4a, 4b, and 4c. However, such examples do not limit the present invention whatsoever.

All three examples show a grid comprising wires extending along two substantially perpendicular directions.

The grid structure may be the consequence of constraints particularly due to the geometry of the cathode of the cathode sputtering device. Indeed, the density, as well as the energy of the generated species, may vary according to the cathode of the device. The position of the object to be covered may also impact the deposition of the solid electrolyte.

Such constraints are also present in the case of a cathode sputtering deposition of "magnetron sputtering" type, for which the cathode comprises a magnet.

The grid shown by FIG. 4a has only one distance between wires whatever the wire direction. It is adapted to a device or reactor where the electric field lines create a homogeneous electronic charge density at the surface of the object to be covered with electrolyte.

The grid shown in FIG. 4b is better adapted to a reactor where the field lines promote the forming of a heterogeneous electron density, at the center of the surface to be covered. The wires forming the grid are thus concentrated at the center of the grid. Accordingly, according to this embodiment, the spacing between two consecutive wires is not regular. The distance between wires may vary from its center to its edge, according to the geometry of the reactor.

However, in the case where the density of charged species is greater on the edges of the surface to be covered, a grid of the type shown in FIG. 4c is preferable.

The grid patterns advantageously reflect the created electron density. The grid thus enables to modulate the potential at the surface of the growing electrolyte layer so that it is the same as that of the opposite surface (in contact with the object).

Accordingly, the grid enables to limit the accumulation of negative charges at the surface and thus to attenuate the lithium depletion.

Figure 1:
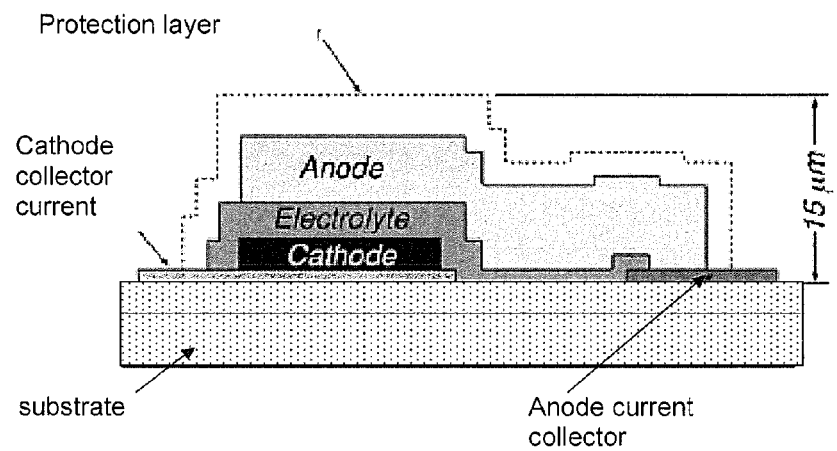
FIG. 1 illustrates the structure of a prior art microbattery.
Figure 2:
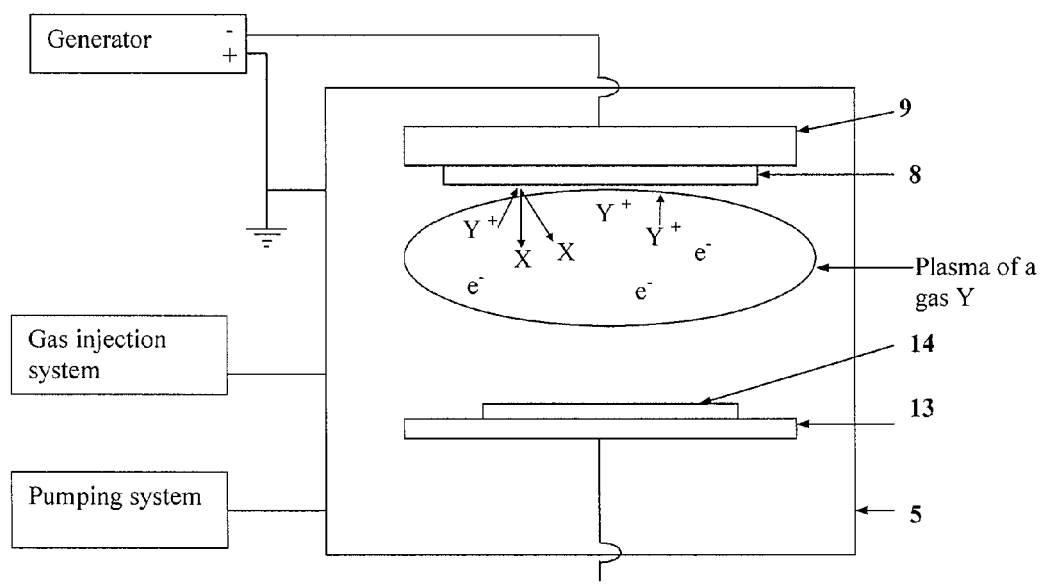
FIG. 2 shows a prior art reactor of vacuum cathode sputtering deposition implementing the cathode sputtering technique.
Figure 5:
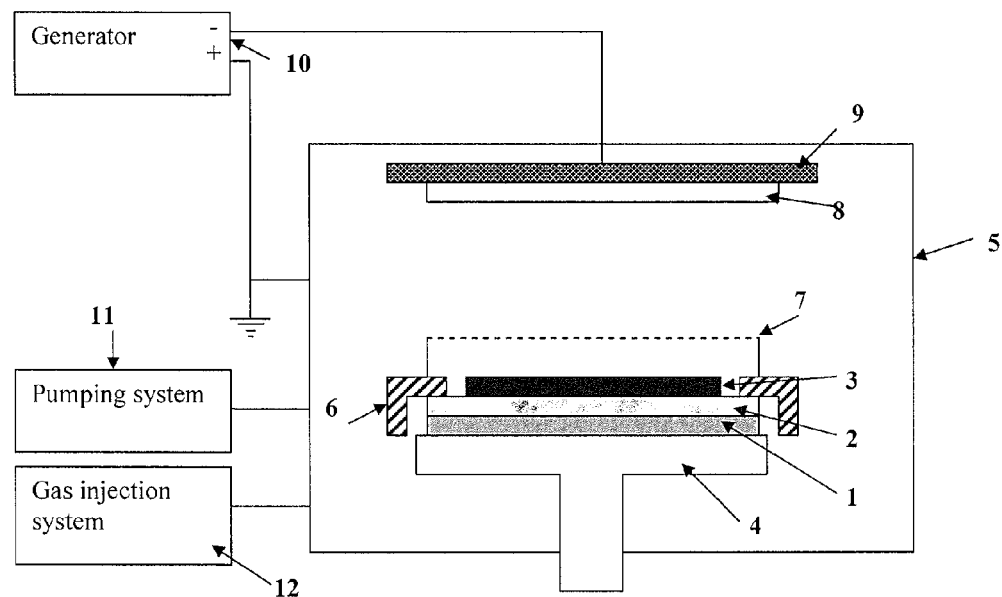
FIG. 5 illustrates a device having a specific embodiment of the method according to the present invention implemented therein.

FIG. 5 shows a device enabling to implement a specific embodiment of the method which is the object of the present invention. In this device, the metal grid is electrically connected to the substrate holder by means of an electrically-conductive ring.

This drawing concerns the preparing of a solid LiPON electrolyte, in a vacuum chamber (5), the object to be covered with LiPON electrolyte being positioned on a substrate holder (4).

The object comprises, towards the substrate holder, a lithiated electrode (3), a metal current collector (2), and a substrate (1).

The substrate may advantageously be made of single-crystal silicon, of metal such as titanium, stainless steel, or of polymeric nature (polyimide, PEN).

The metallic current collector may advantageously be made of a titanium, tungsten, platinum, or copper layer.

The lithiated electrode (3) is made of a material comprising lithium (3).

The substrate holder (4) and the object (electrode (3)) are electrically connected by means of a metal ring (6) in order to provide an electric continuity between the ring (6) and the metal current collector (2).

A metal grid (7) is attached/connected to this ring (6) to provide an electric continuity between the two parts. The latter is made of 316L-type stainless steel. It has a 2-mm square mesh, that is, a distance between wires of 2 mm along two perpendicular directions. The thickness of the 316L stainless steel wire is 200 μm.

The grid is positioned at a 1.5-cm distance from the object to be covered with LiPON electrolyte.

Simultaneously, a layer of target material of chemical composition $Li_3PO_4$ (8) is bonded to the cathode (9) of the reactor (5).

The cathode is submitted to the application of an electric radio frequency field due to the use of an electric generator (10).

Further, a pumping system (11) is connected to the deposition chamber (5) to be able to create vacuum.

A gas injection system (12) enables to inject a controlled nitrogen flow into the chamber (5).

A solid LIPON electrolyte is thus deposited on the lithiated electrode (3) while limiting or canceling the depletion phenomenon.

The invention claimed is:
1. A method of forming a solid lithium-based electrolyte for a solid microbattery, by cathode sputtering of a target lithium-based material in a cathode sputtering device comprising a cathode supporting the lithium-based target material and an object supported by a substrate holder, wherein:
   the target lithium-based material is sputtered;
   a solid lithium-based electrolyte is formed on the object;

and wherein prior to the sputtering of the target lithium-based material, a grid made of lithium-free electrically-conductive material, is interposed between the object and the lithium-based target material, and the grid and the substrate holder are electrically connected, wherein a distance between the grid and the object is shorter than a distance between the grid and the lithium-based target material, and wherein the grid is adapted to attenuate lithium depletion upon growth of the solid lithium-based electrolyte.

2. The solid electrolyte forming method of claim 1, wherein the grid of electrically-conductive material is made of a metal selected from the group consisting of titanium, stainless steel, tungsten, aluminum, platinum, copper, and alloys and mixtures thereof.

3. The solid electrolyte forming method of claim 1, wherein the grid is positioned at a distance in the range from 1 to 100 millimeters from the object.

4. The solid electrolyte forming method of claim 1, wherein the lithium-based target material is a solid lithium-based material selected from the group consisting of $Li_3PO_4$, LiSiPON, LiGePS, and LiSON.

5. The solid electrolyte forming method of claim 1, wherein the cathode sputtering is performed in the presence of nitrogen.

6. The solid electrolyte forming method of claim 1, wherein the grid has a thickness smaller than 10 millimeters.

7. The solid electrolyte forming method of claim 1, wherein the grid is made of a plurality of wires extending along at least two directions.

8. The solid electrolyte forming method of claim 7, wherein the wires along a same direction are spaced apart by a distance in the range from 0.5 millimeters to 2 centimeters.

9. The solid electrolyte forming method of claim 1, wherein the object successively comprises, towards the substrate holder, a lithiated electrode, a current collector, and a substrate.

10. The solid electrolyte forming method of claim 9, wherein the grid is also electrically connected to at least one of the substrate, the current collector and the lithiated electrode.

11. The solid electrolyte forming method of claim 1, wherein the electric connection between the grid and at least the substrate holder is provided by a metal ring.

12. The solid electrolyte forming method of claim 1, wherein the electrolyte material is selected from the group consisting of LiPON, LiSiPON, and LiSON.

13. The solid electrolyte forming method of claim 3, wherein the grid is positioned at a distance in the range of 5 to 50 millimeters from the object.

14. The solid electrolyte forming method of claim 6, wherein the grid has a thickness from 5 to 50 micrometers.

15. The solid electrolyte forming method of claim 8, wherein the wires along a same direction are spaced apart by a distance of 2 millimeters.

* * * * *